(12) United States Patent
Sheng (10) Patent No.: US 8,912,849 B2
(45) Date of Patent: Dec. 16, 2014

(54) ADAPTIVE OPERATIONAL AMPLIFIER BIAS CURRENT

(71) Applicant: MStar Semiconductor, Inc., Hsinchu Hsien (TW)

(72) Inventor: Li-Wei Sheng, Irvine, CA (US)

(73) Assignee: MStar Semiconductor, Inc., Hsinchu Hsien (TW)

( * ) Notice: Subject to any disclaimer, the term of this patent is extended or adjusted under 35 U.S.C. 154(b) by 51 days.

(21) Appl. No.: 13/873,692

(22) Filed: Apr. 30, 2013

(65) Prior Publication Data

US 2014/0320208 A1 Oct. 30, 2014

(51) Int. Cl.
*H03F 3/45* (2006.01)

(52) U.S. Cl.
CPC .................. *H03F 3/45179* (2013.01)
USPC ........................................... 330/261; 330/257

(58) Field of Classification Search
USPC .......................................... 330/261, 257, 253
See application file for complete search history.

(56) References Cited

U.S. PATENT DOCUMENTS

| | | | |
|---|---|---|---|
| 4,794,349 A | 12/1988 | Senderowicz et al. | |
| 4,959,622 A | 9/1990 | Kearney | |
| 7,286,011 B2 | 10/2007 | Chang et al. | |
| 7,741,911 B2 * | 6/2010 | Kao et al. | 330/261 |
| 7,834,695 B2 * | 11/2010 | Esch | 330/257 |
| 8,319,554 B1 * | 11/2012 | Das | 330/258 |

* cited by examiner

*Primary Examiner* — Henry Choe
(74) *Attorney, Agent, or Firm* — Edell, Shapiro & Finnan, LLC (57) ABSTRACT

An operation amplifier (op amp) having a bias current detection circuit that monitors the bias current flowing in an output stage of the op amp. When the bias current detection circuit detects that too much current is being wasted, e.g., sunk to ground, then the amount of bias current is reduced. Similarly, when the bias current detection circuit detects that insufficient bias current is being supplied to the output stage of the op amp, the amount of bias current is increased. In one implementation, the output of the bias current detection circuit may be signals indicative of, respectively, too much bias current and too little bias current, wherein those outputs are supplied to a state machine which is configured to control the amount of bias current being supplied in a stepwise fashion.

19 Claims, 6 Drawing Sheets

FIG.5

ADAPTIVE OPERATIONAL AMPLIFIER BIAS CURRENT

TECHNICAL FIELD

The present disclosure relates to operational amplifiers, and particularly to an adaptive bias scheme to reduce power consumption.

BACKGROUND

The operational amplifier (op amp) is an essential circuit building block of universal importance. Op amps are extremely versatile and are used in innumerable applications. One such application is to amplify an analog input signal to drive a load connected to an output of the op amp.

In a conventional class A operation op amp circuit, selected transistors are employed as bias current providers for providing bias currents. The control terminals of these transistors are coupled to constant bias voltages; hence the bias currents provided by these transistors have fixed values.

As such, after a conventional operational amplifier circuit is properly installed and supply voltages are applied to the operational amplifier circuit, power will be continually consumed by the op amp's bias current components. However, in practice, an op amp circuit may not have a 100% duty cycle. For example, if no signal is input to the operational amplifier, the op amp will not be under operation, and as such no driving operation (current supplied to a load) will be performed by the operational amplifier circuit. Nonetheless, even when the operational amplifier is not under operation, power will be continually consumed by the transistors that are configured to provide the constant bias currents. In other words, power associated with "unused" bias current is wasted.

The foregoing issue is particularly problematic in wireless applications, such as cellular telephones that have limited battery power. When an op amp is used as part of a front end of a receiver in a wireless device, that receiver is preferably capable of handling signals with wide dynamic ranges. With a typical class-A operation op amp, relatively high DC bias current is needed to accommodate received signals. For example, in a given wireless spectrum, a large "blocker" signal may be present adjacent a signal of interest. While such a blocker signal may not always be present, the receiver of the wireless device, i.e., a circuit including an op amp, must nevertheless be capable of handling the larger dynamic range that is driven by the intermittent (or low duty cycle) blocker signal. When the blocker signal is not present, the supplied bias current is wasted, thereby unnecessarily wasting battery power.

It is noted that a class AB operation op amp can provide high output current with low DC bias current, but such a configuration suffers from insufficient linearity, especially in the presence of relatively large blocker signals.

There is accordingly a need to provide an improved class A operation op amp that addresses the undesirable waste of bias current.

SUMMARY

To address the forgoing issues, an embodiment of the present invention comprises an operation amplifier having a bias current detection circuit that mirrors or monitors the bias current flowing in an output stage of the op amp. When the bias current detection circuit detects that too much current is being wasted, e.g., sunk to ground, then the amount of supplied bias current is reduced. Similarly, when the bias current detection circuit detects that insufficient bias current is being supplied, the amount of supplied bias current is increased. In one implementation, the output of the bias current detection circuit may be signals indicative of, respectively, too much bias current and too little bias current, wherein those outputs are supplied to a state machine which is configured to control the amount of bias current being supplied to the output stage of the op amp in a stepwise fashion.

DESCRIPTION OF EXAMPLE EMBODIMENTS

The present inventive concept is best described through certain embodiments thereof, which are described in detail herein with reference to the accompanying drawings, wherein like reference numerals refer to like features throughout. It is to be understood that the term invention, when used herein, is intended to connote the inventive concept underlying the embodiments described below and not merely the embodiments themselves. It is to be understood further that the general inventive concept is not limited to the illustrative embodiments described below and the following descriptions should be read in such light.

Additionally, where mathematical expressions are contained herein, the principles conveyed thereby are to be taken as being thoroughly described thereby. It is to be understood that where mathematics are used, such is for succinct description of the underlying principles being explained and, unless otherwise expressed, no other purpose is implied or should be inferred. It will be clear from this disclosure overall how the mathematics herein pertain to the present invention and, where embodiment of the principles underlying the mathematical expressions is intended, the ordinarily skilled artisan will recognize numerous techniques to carry out physical manifestations of the principles being mathematically expressed.

The figures described herein include schematic block diagrams illustrating various functional modules for purposes of description and explanation. Such diagrams are not intended to serve as electrical schematics and interconnections illustrated are merely to depict signal flow, various interoperations between functional components and/or processes and are not necessarily direct electrical connections between such components. Moreover, the functionality illustrated and described via separate components need not be distributed as shown, and the discrete blocks in the diagrams are not necessarily intended to depict discrete electrical components.

Figure 1:
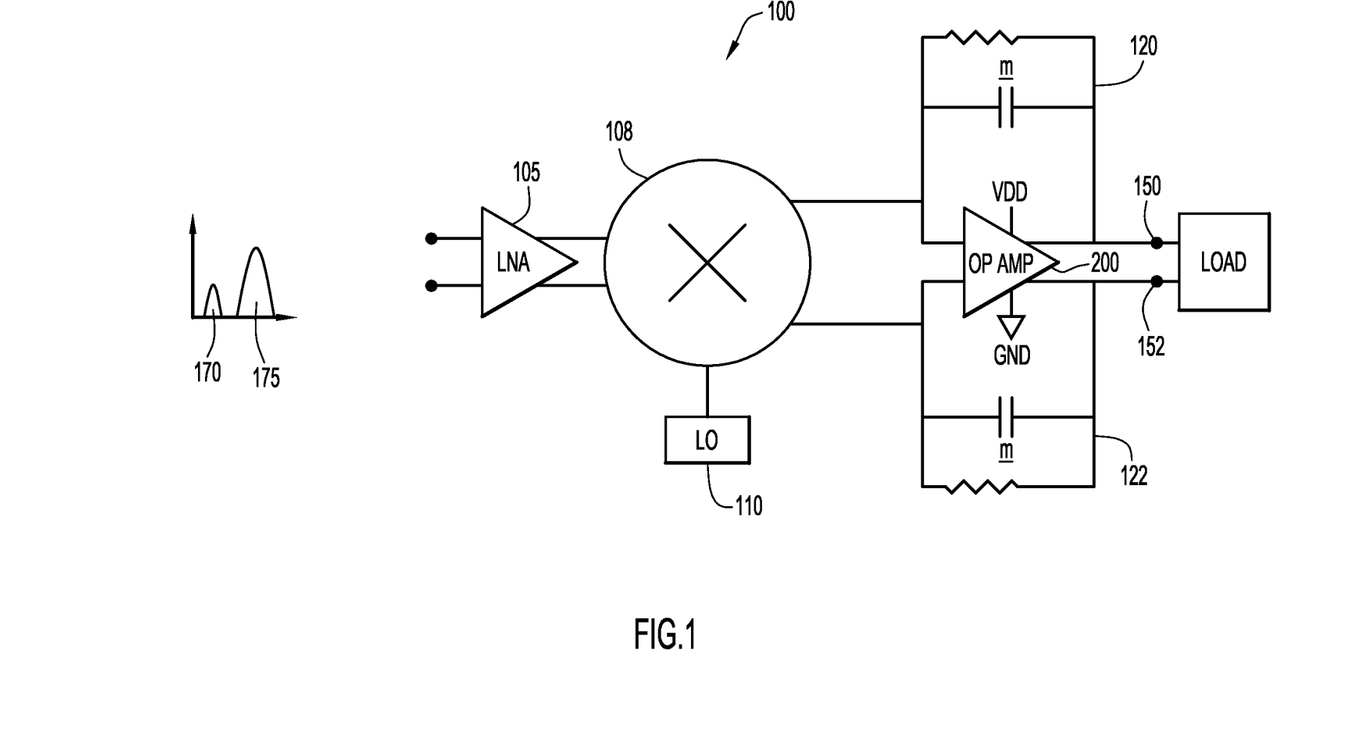
FIG. 1 is a schematic diagram of a circuit in which a differential operational amplifier according to the invention may be used.

FIG. 1 is a schematic diagram of a circuit in which a differential operational amplifier according to the invention may be used. More specifically, FIG. 1 depicts an example front end 100 of a receiver including a low noise amplifier 105, a mixer 108 and local oscillator 110, operation amplifier 200 (in which elements of the present invention are embodied), appropriate feedback circuitry 120, 122 (including resistance and capacitance) and differential output nodes 150 and 152 that may be connected to a downstream load 160. Op amp 200 is connected to a supply voltage, VDD, and may be grounded as indicated in the drawing.

In operation, the front end may receive differential signals at the input of the low noise amplifier 105, mix those signals with a local oscillator to obtain a base band differential signal, and supply the resulting baseband differential signal to op amp 200 for amplification for downstream components, generally represented by load 160.

As noted earlier, the receiver may not only receive a given signal of interest, e.g., signal 170, but may also receive signals that may be considered blocker signals, e.g., signal 175, as shown in FIG. 1. Moreover, blocker signal 175 may have an amplitude that is greater than that of the signal of interest 170. And, blocker signal 175 may not be present at all times, but may instead be intermittent and/or have a low duty cycle. However, regardless of how intermittent blocker signal 175 might be, op amp 200 is preferably configured to handle the greater amplitudes of blocker signal 175 without clipping its output signal so that downstream components can effectively demodulate and, ultimately, reject that component of the overall received signal. To avoid clipping in the output, sufficient bias current must be supplied to op amp 200 to handle blocker signal 175. However, when blocker signal 175 is not present, the "extra" bias current that is supplied to handle the higher amplitude blocker signal 175 is not used and ends up being sunk to ground, i.e., wasted.

Figure 2:
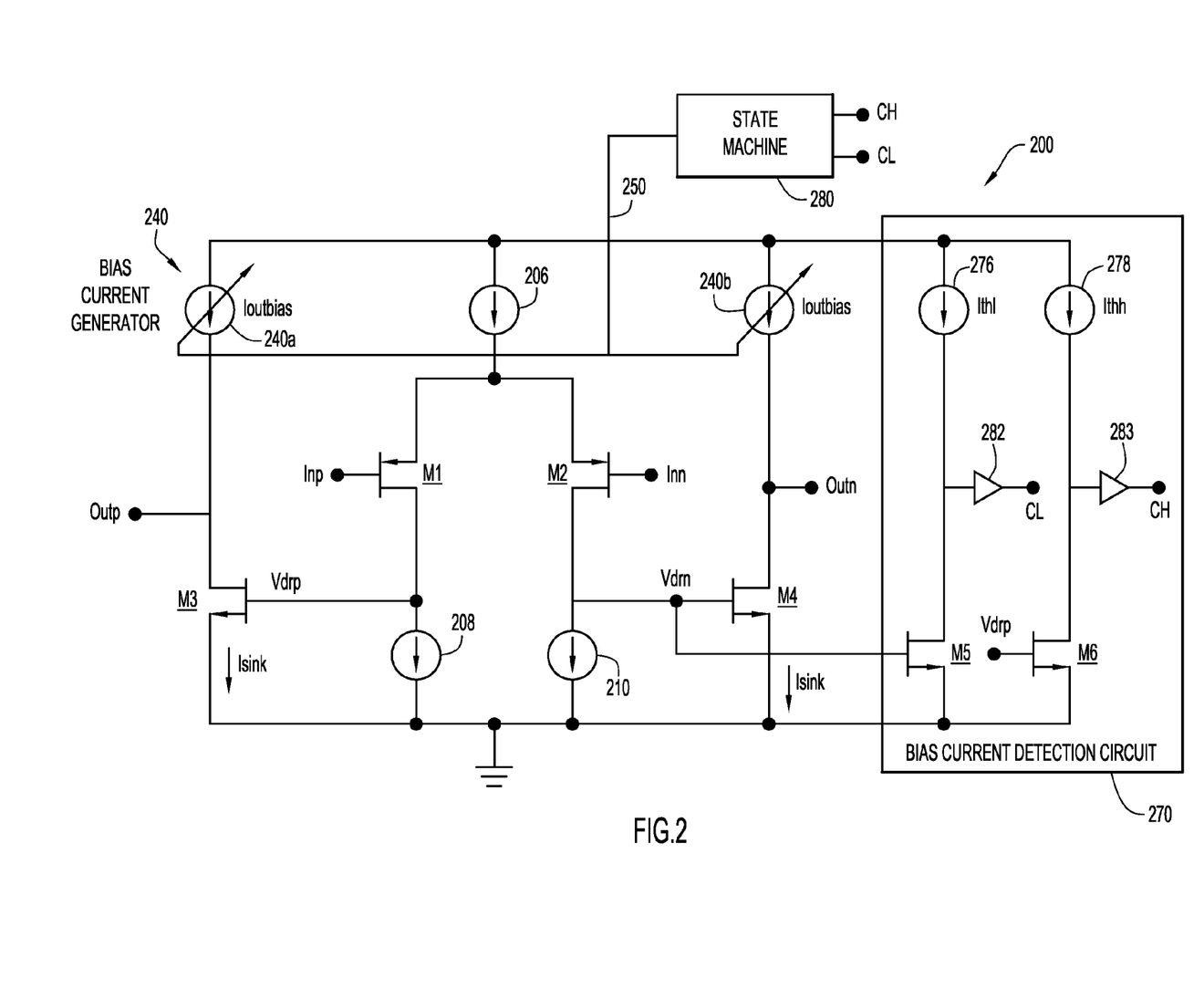
FIG. 2 is a simplified schematic diagram of an operational amplifier, a bias current detection circuit and associated state machine in accordance with an embodiment of the present invention.

FIG. 2 is a simplified schematic diagram of an operational amplifier, bias current detection circuit and associated state machine for controlling bias current in accordance with an embodiment of the present invention. In FIG. 2, op amp 200 is a differential operational amplifier, like that shown in FIG. 1. However, those skilled in the art will appreciate that the inventive concepts described herein are not limited to differential applications.

Op amp 200 includes, as depicted, a positive input node (Inp) and a negative input node (Inn) associated with control gates or respective transistors M1 and M2. Transistors M1 and M2, as well as the other transistors described in connection with FIG. 2 may be metal oxide semiconductor field effect transistors (MOSFETs), but the invention should not be construed as being limited to such devices. Transistors M1 and M2 are supplied with a bias current 206 from a power supply (represented by VDD). Bias current 206, is split between the positive and negative input transistors M1 and M2 as depicted by constant current sources 208 and 210. The foregoing components may be considered collectively to be part of an input stage of op amp 200.

Op amp 200 further includes a positive output node (Outp) and a negative output node (Outn), which are taken from, e.g., the drain terminals of respective output transistors M3 and M4. The gate signals applied to transistors M3 and M4 are, respectively, positive drive (Vdrp) and negative drive (Vdrn). Transistors M3 and M4 receive a bias current supplied by constant current sources 240a and 240b, collectively referred to as bias current generator 240. The foregoing components may be considered collectively to be part of an output stage of op amp 200. As shown, bias current generator 240 is controlled via a connection 250 by a state machine 280 described more fully below.

Op amp 200 still further includes a bias current detection circuit 270. In effect, bias current detection circuit 270 monitors the amount of current needed to pass through output transistors M3 and M4. This is accomplished by "mirroring" the needed current via the Vdrp and Vdrn signals present at the gate nodes of transistors M3 and M4, and supplying those signals as gate control signals to transistors M5 and M6 in bias current detection circuit 270. In one implementation, the mirrored Vdrp, Vdrn signals may be configured as a ratio, e.g., 10:1. Consequently, bias current detection circuit 270 may be configured to cause 1/10 of the amount of current to flow through transistors M5 and M6 in comparison with the current flowing through transistors M3 and M4 at any moment in time. The indicated ratio may be effected by one or more of several ways. For example, the channel dimensions of M5 and M6 may be 1/10 the size of M3 and M4. Alternatively, the Vdrp and Vdrn signals, as supplied to M5 and M6 may be manipulated via a voltage divider circuit (not shown) that reduces those signals to a tenth of their magnitudes. Constant current sources 276, 278 (discussed more fully below) can be configured to supply 1/10 of the current of bias current generator 240. Those skilled in the art will appreciate that other approaches to mirroring the bias current flowing through M3 and M4 can also be implemented without departing from the scope of the present invention.

As can be seen from FIG. 2, the more bias current that is sunk to ground, indicated by the Isink arrow (i.e., the less current that is supplied through either of the output nodes (Outp, Outn)), the higher the amount of "wasted" bias current. Likewise, the lower the amount of bias current being sunk to ground, the lower the amount of "wasted" bias current. Since the current being monitored by bias current detection circuit 270 is disposed below the respective output nodes, bias current detection circuit 270 can accurately determine the amount of excess bias current or shortage of bias current being supplied to the output stage of operational amplifier 200.

The output of bias current detection circuit 270 outputs two signals, a current too low (CL) signal and a current too high (CH) signal, both supplied via, e.g., inverting Schmitt triggers 282 and 283, respectively. Using constant current sources 276 and 278 as low and high bias current threshold levels, respectively, the respective Schmitt triggers 282, 283 provide an output relative to the Vdrn and Vdrp gate control signal levels, i.e., an output representing whether the current flowing through the respective output transistors M3 and M4 is higher or lower than the threshold current levels of the respective constant current sources 276 and 278.

For example, consider the case where the output stage bias current being supplied by bias current generator 240 is considered to be too high. This means that there is an excess amount of bias current flowing in the output stage of op amp 200 (in view of the input signal to the op amp 200) and that excess amount of current is being sunk to ground, at least partially, via M3. The expected or desired current through M3 is mirrored at M6 via Vdrp. That is, for a known magnitude of Vdrp, a known amount of current is output from Outp. In this case, Vdrp will be low for the amount of bias current being supplied, thus making M6 conduct less. As a result, the input to Schmitt trigger 283 is high, resulting in a low output from Schmitt trigger 283. Accordingly, when the output stage bias current is considered too high (as compared to Ithh), CH=Low. In other words, if one considers the extreme case, when Inp at M1 is high, M1 conducts and thus Vdrp=0, M3 is off, M6 is off, and thus the input at Schmitt trigger 283 is pulled high at a result of the constant current source 278, thus CH=L.

Now consider the case where the output stage current being supplied by bias current generator 240 is considered to be too low. This means that there is an insufficient amount of bias current flowing in the output stage of op amp 200, i.e., there is not enough bias current "in reserve" in the output stage to supply to, e.g., Outp, in view of the input signal to op amp 200. The fact that there is an insufficient amount of bias current flowing through M3 is signaled at M6 via Vdrp in conjunction with constant current source 278. Specifically, because Vdrp is high, M6 will conduct more of the constant current supplied by constant current source 278 to ground. As a result, the input to Schmitt trigger 283 is low, resulting in a high output from Schmitt trigger 283. That is, when the output stage bias current is considered too low, CH=High.

Those skilled in the art will appreciate that the analysis described above is equally applicable to the negative branch of the output stage of op amp 200 and low threshold current Ithl flowing through transistor M5. Specifically, when there is too much bias current flowing through M4 for the (lower) amplitude of Vdrn, M5 will conduct less of the current supplied by constant current source Ithl 276 causing the input to Schmitt trigger 282 to be high, such that the output of Schmitt trigger 282 will be low. In contrast, when there is too little current flowing through M4 for the (higher) amplitude of Vdrn, M5 will conduct more of the current supplied by constant current source Ithl 276, causing the input to Schmitt trigger 282 to be low, such that the output of Schmitt trigger 282 will be high.

From the foregoing explanation, those skilled in the art will appreciate that when the amount of bias current flowing in the output stage of op amp 200 is considered to be too high, CH and CL are both Low. When the amount of bias current flowing in the output stage of op amp 200 is considered to be too low, CH and CL are both High. That is, when the sensed Vdrn and Vdrp signals at M5 and M6 cause more of the current for constant current sources 276 and 278 to be sunk to ground through those transistors, then the inputs to Schmitt triggers 282 and 283 become low, causing the outputs thereof to be High, and vise versa.

When CH≠CL (i.e., when CH and CL are not the same) then the amount of bias current is considered to be adequate, i.e., the amount of current is neither too high nor too low for the instant operating conditions of op amp 200.

Figure 3:
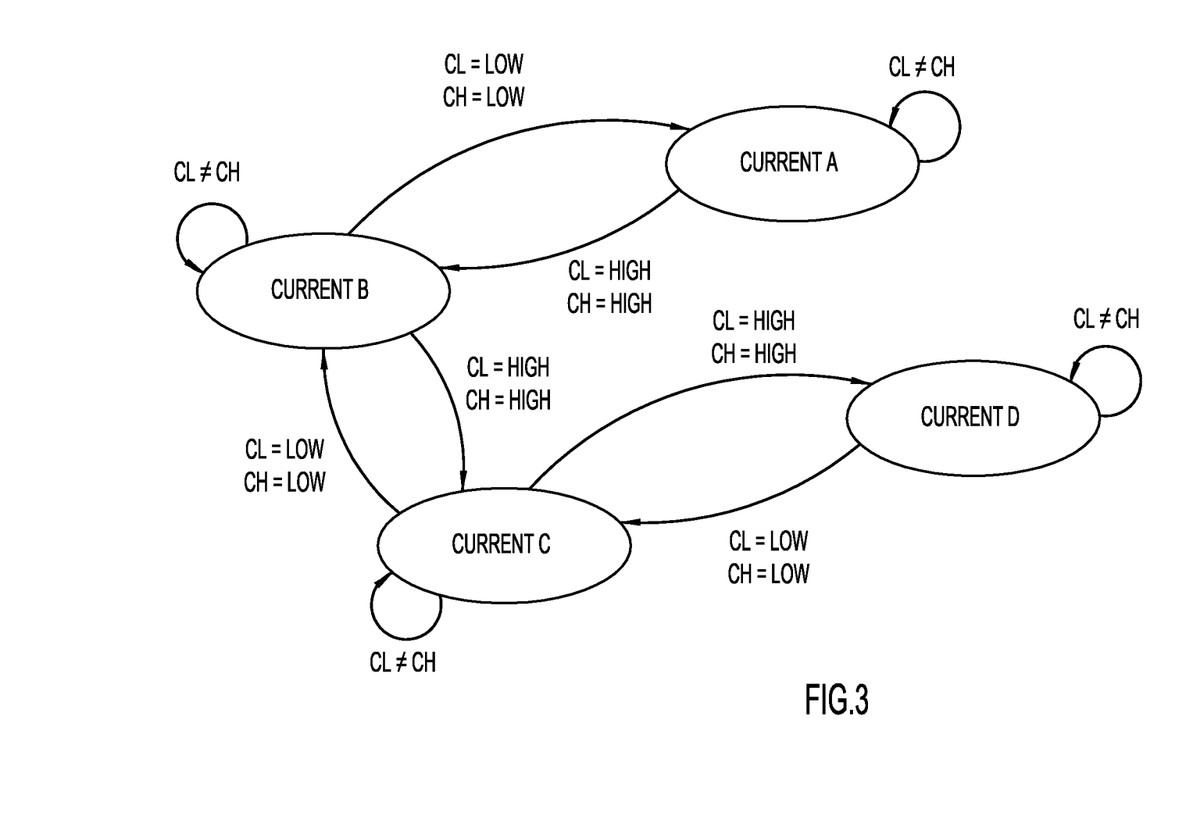
FIG. 3 shows an example state machine 280 that may be employed in connection with embodiments of the present invention.

As mentioned previously, the CH and CL signals output by bias current detector circuit 200 are supplied to a state machine 280 (which may be implemented in hardware or software or a combination thereof). FIG. 3 shows an example state machine 280 that may be employed in connection with embodiments of the present invention. In this example case, bias current generator 240 is configured to supply four discrete amounts of bias current, Current A, Current B, Current C, and Current D, with Current A being the lowest amount of bias current and Current D being the highest amount of bias current. That is, the listed currents are defined such that Current A<Current B<Current C<Current D. Assume that bias current generator defaults to Current B on power up of the op amp 200. If, during subsequent operation, it is detected that too much bias current is flowing in the output stage and being wasted, it would be expected that bias current detection circuit 270 would supply signals of CH=Low and CL=Low. As a result, the state of state machine 280 would move to Current A, as shown in FIG. 3. If, subsequently, in the Current A state, it is determined that too little bias current is flowing in the output stage, then both CH and CL would be High, resulting in the state changing back to Current B.

When an appropriate amount of bias current is flowing in the output stage of op amp 200, then CH and CL will have different signal levels. In such a case, the state of state machine 280 does not change, as indicated by the loop back to the same state when CH and CL are not equal.

As shown in FIG. 3, four different levels of bias current may be indicated by state machine 280. However, in other possible implementations, more or fewer individual states may be provided. For example, an eight state machine could be provided wherein the state machine generates a 3-bit word, one for each state, from 000 to 111. Such a 3-bit word can be supplied to bias current generator 240 via connection 250 to indicate the amount of bias current to supply to the output stage of op amp 200.

Figure 4A:
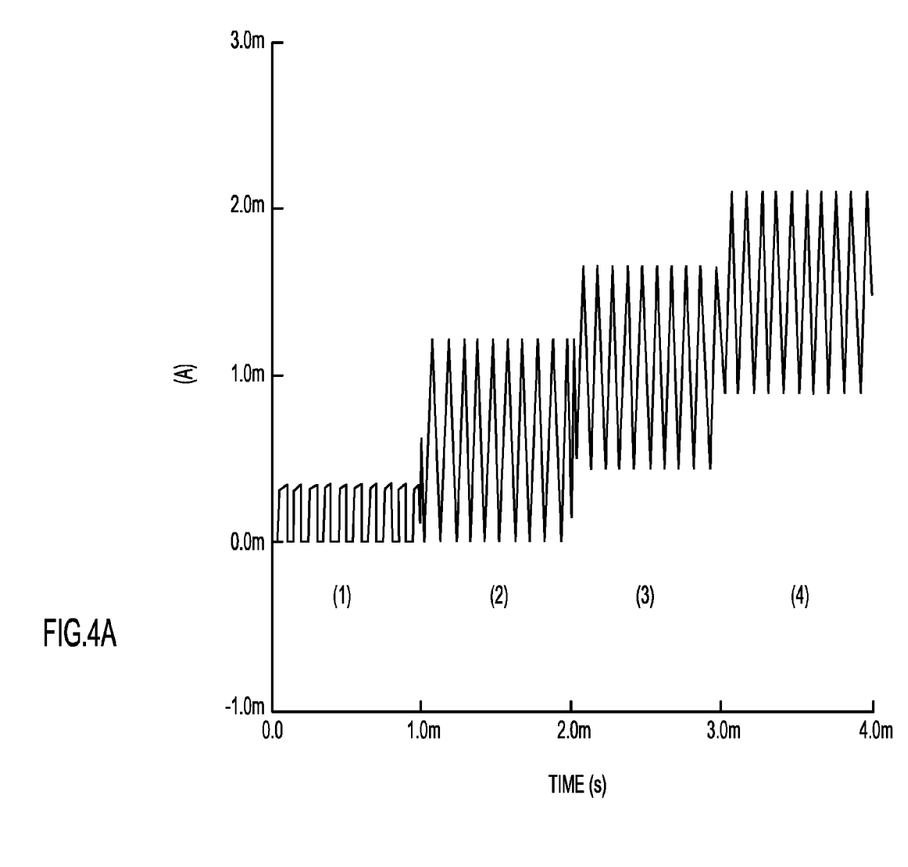
FIGS. 4A-C are plots showing the relationship among the operational amplifier's output stage bias current, output of the bias current detection circuit and output voltage of the operational amplifier in accordance with embodiments of the present invention.
Figure 4B:
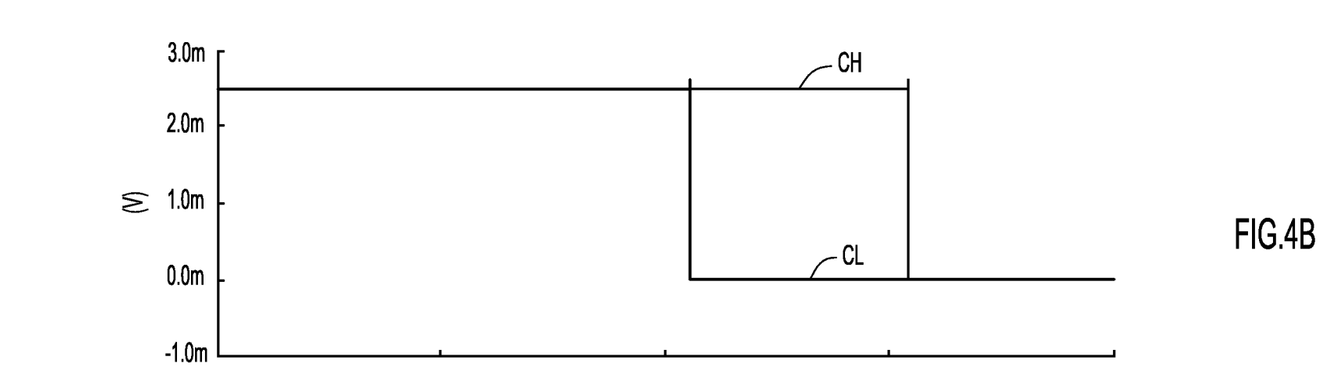
Figure 4C:
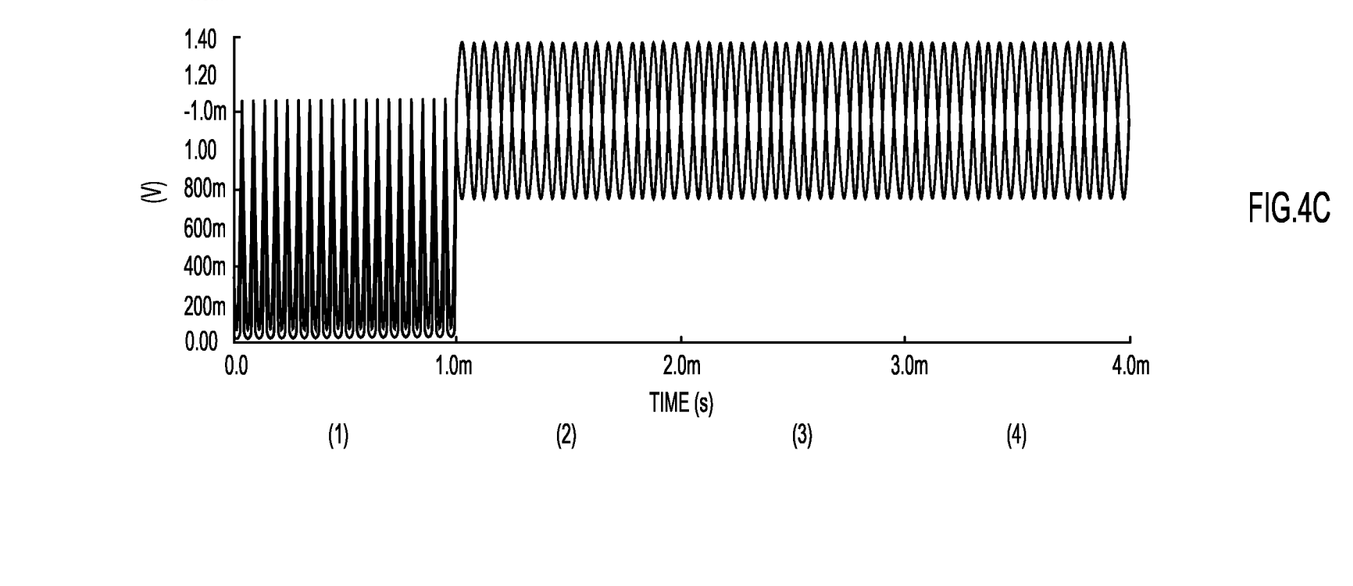

Reference is now made to FIGS. 4A-C. FIG. 4A is a plot of output stage bias current. Four different 1 millisecond instances are depicted and numbered as regions (1)-(4). FIG. 4B is a plot of the CH and CL signals supplied by bias current detection circuit 270 using the same time scale. Finally, FIG. 4C is a plot of the output voltage of op amp 200, also using the same time scale. As indicated, the time scale has been divided into four regions: region (1), region (2), region (3) and region (4).

In region 1 of FIG. 4A, relatively little bias current is indicated (for the amplitude levels of Vdrp and Vdrn). Accordingly, both CH and CL are High as shown in FIG. 4B. Further, because insufficient bias current is being supplied to the output stage of op amp 200, the output voltage in region (1) is slightly distorted (compare the top and bottom regions of the plot in region (1)). That is, the output stage is unable to supply sufficient output current in response to an input signal at the input stage. In light of the conditions in region (1) and the resulting High levels of CH and CL, an incremental increase in bias current results as indicated in region (2) of FIG. 4A. FIG. 4C indicates in region (2) that the output voltage of op amp 200 is symmetric and appears to be acceptable. Nevertheless, because of the current threshold levels in bias current detection circuit 270, both CH and CL remain high, which means that, by design, still more bias current is desirable in the output stage of op amp 200.

Region (3) of FIG. 4A shows still more bias current being supplied. And, region (3) of FIG. 4B shows that the bias current is no longer too low (or too high) since CL has gone Low and CH remains high (the latter meaning that the bias current is not too high). The output voltage in region (3) of FIG. 4C remains stable.

Then, in region (4) of FIG. 4B, it can be seen that both CH and CL are low. This case is indicative of the output stage bias current being too high for the amount of current needed to support the amplitudes of Vdrp and Vdrn, as shown in region (4) of FIG. 4A. It is noted that the output voltage in region (4) of FIG. 4C remains stable. However, by design, and responsive to the set threshold currents in bias current detection circuit 270, it is determined that the output stage bias current is too high, and should be reduced.

Figure 5:
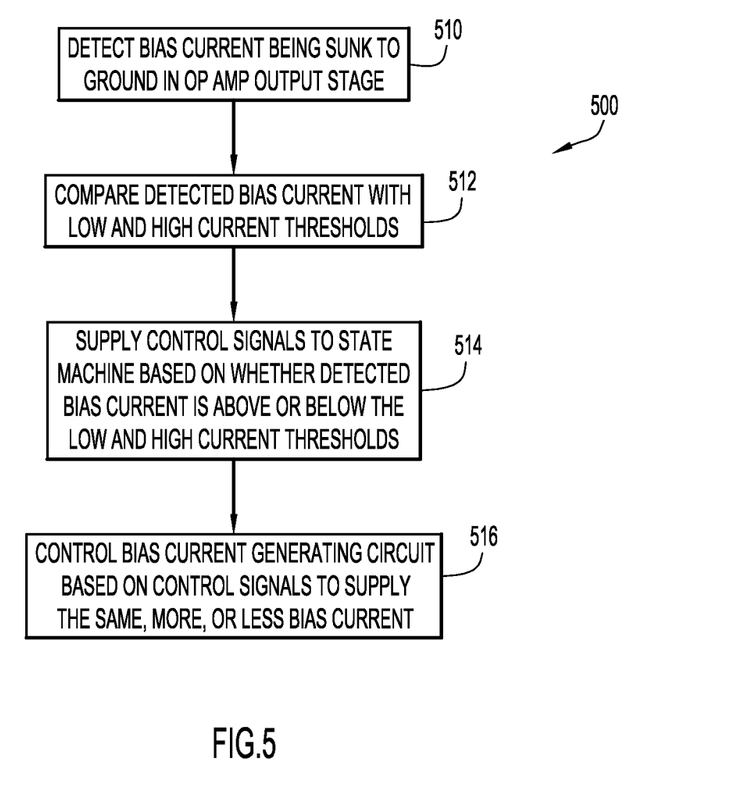
FIG. 5 is a flow diagram illustrating an exemplary bias current control process by which the present general inventive concept can be embodied.

FIG. 5 is a flow diagram illustrating an exemplary bias current control process 500 by which the present general inventive concept can be embodied. In step 510, bias current being sunk to ground in an output stage of an operational amplifier is detected. In step 512, the detected bias current is compared with predetermined low and high current thresholds. In step 514, control signals are supplied to a state machine wherein the control signals are generated based on whether the detected bias current is above or below each of the low and high predetermined low and high current thresholds. In step 516, a bias current generating circuit is controlled based on the control signals to supply the same, more or less bias current to the output stage of the op amp.

By the foregoing process 500 it is possible to more efficiently control bias current supplied to class A operation operational amplifiers. That is, techniques and methods described herein monitor "wasted" bias current in the output stage of the op amp and dynamically adjust the bias current based on the need at any given time.

In an alternative embodiment, instead of using a current mirror, a very small resistance (not shown) could be placed in series between the respective output nodes of the op amp and ground. The amount of current flowing to ground could then be detected directly as a voltage, which could be supplied to the state machine 280.

In sum, there is provided an operational amplifier circuit for class A operation having an input stage having at least one input node, a bias current generator, an output stage having at least one output node configured to output a signal responsive to a signal input at the at least one input node and configured to receive a bias current from the bias current generator, and a bias current detection circuit configured to detect whether an amount of bias current flowing in the output stage is above or below a predetermined threshold and to cause the bias current generator to change the amount of bias current being supplied to the output stage.

A method is also provided comprising detecting bias current being sunk to ground in an output stage of an operational amplifier, comparing the detected bias current with predetermined low and high current thresholds, supplying control signals to a state machine wherein the control signals are generated based on whether the detected bias current is above or below each of the low and high predetermined low and high current thresholds, and controlling an amount of bias current being supplied to the output stage of the operational amplifier based on the control signals input to state machine to supply the same, more or less bias current Although a hardware implementation may be preferable, it is possible to incorporate firmware and/or software in an appropriate design. In such a case, processor instructions implementing the disclosed technique may be encoded on non-transitory computer-readable media. The present general inventive concept, when so embodied, can be practiced regardless of the processing platform on which the processor instructions are executed and regardless of the manner by which the processor instructions are encoded on the computer-readable medium.

It is to be understood that the computer-readable medium described above may be any non-transitory medium on which the instructions processor instructions that implement, for example, process 500 in FIG. 5, may be encoded and then subsequently retrieved, decoded and executed by a processor, where such media includes electrical, magnetic and optical storage devices. Examples of non-transitory computer-readable media include, but not limited to, read-only memory (ROM), random-access memory (RAM), and other electrical storage; CD-ROM, DVD, and other optical storage; and magnetic tape, floppy disks, hard disks and other magnetic storage. The processor instructions may be derived from algorithmic constructions in various programming languages that realize the present invention as exemplified by the embodiments described above.

The descriptions above are intended to illustrate possible implementations of the present inventive concept and are not restrictive. Many variations, modifications and alternatives will become apparent to the skilled artisan upon review of this disclosure. For example, components equivalent to those shown and described may be substituted therefore, elements and methods individually described may be combined, and elements described as discrete may be distributed across many components. The scope of the invention should therefore be determined not with reference to the description above, but with reference to the appended claims, along with their full range of equivalents.

What is claimed is:

1. An operational amplifier circuit, comprising:
    an input stage having at least one input node to receive an input signal;
    a bias current generator configured to generate a bias current;
    an output stage having at least one output node configured to output a signal responsive to the input signal input at the at least one input node and configured to receive the bias current from the bias current generator; and
    a bias current detection circuit configured to detect a comparison result of an amount of the bias current flowing in the output stage and a predetermined threshold and to control the bias current generator to generate the amount of bias current being supplied to the output stage in accordance to the comparison result.

2. The operational amplifier circuit of claim 1, further comprising a state machine configured to receive an input from the bias current detection circuit and to supply a control signal to the bias current generator.

3. The operational amplifier circuit of claim 2, wherein the state machine is configured to supply a multi-bit word to the bias current generator.

4. The operational amplifier circuit of claim 1, wherein the bias current detection circuit comprises a circuit configured to mirror the current of the output stage.

5. The operational amplifier circuit of claim 4, wherein the current of the output stage is detected at a node between the at least one output node and ground.

6. The operational amplifier circuit of claim 1, wherein the bias current detection circuit comprises a Schmitt trigger that is configured to supply an output of the bias current detection circuit.

7. The operational amplifier circuit of claim 1, wherein the bias current detection circuit is configured to detect the comparison result to reflect whether the amount of the bias current flowing in positive and negative branches of the output stage are above or below respective predetermined thresholds and to cause the bias current generator to generate the amount of bias current being supplied to the output stage in accordance with whether the amounts of bias current are above or below the respective predetermined thresholds.

8. The operational amplifier circuit of claim 1, wherein the bias current generator is controllable to change the amount of bias current being supplied to the output stage in predetermined steps.

9. The operational amplifier circuit of claim 1, wherein the operational amplifier circuit operates in accordance with class A operation.

10. A method of operating an operational amplifier, comprising:
    detecting bias current being sunk to ground in an output stage of an operational amplifier;
    comparing the detected bias current with predetermined low and high current thresholds;
    supplying control signals to a state machine wherein the control signals are generated based on whether the detected bias current is above or below each of the low and high predetermined low and high current thresholds; and controlling an amount of bias current being supplied to the output stage of the operational amplifier based on the control signals input to state machine to supply the same, more or less bias current.

11. The method of claim 10, wherein controlling the amount of bias current comprises sequentially and incrementally increasing or decreasing the amount of bias current being supplied to the output stage of the operational amplifier.

12. The method of claim 10, further comprising generating a multi-bit word indicative of the amount of bias current being supplied to the output stage of the operational amplifier.

13. The method of claim 10, wherein the step of detecting bias current comprises mirroring bias current in the output stage of the operational amplifier.

14. The method of claim 13, wherein the step of detecting bias current comprises mirroring the bias current in the output stage of the operational amplifier at a node between an output node of the operational amplifier and ground.

15. The method of claim 10, wherein the step of supplying control signals comprises supplying the control signals via Schmitt triggers.

16. The method of claim 10, wherein the operational amplifier is a differential amplifier.

17. The method of claim 10, further comprising detecting whether the amount of bias current flowing in positive and negative branches of the output stage are above or below respective predetermined thresholds and causing the amount of bias current being supplied to the output stage to be changed in accordance with whether the amounts of bias current are above or below the respective predetermined thresholds.

18. The method of claim 10, further comprising controlling the amount of bias current being supplied to the output stage in predetermined steps.

19. The method of claim 10, further comprising operating the operational amplifier in accordance with class A operation.

* * * * *